US009106208B2

(12) United States Patent
Visconti et al.

(10) Patent No.: US 9,106,208 B2
(45) Date of Patent: *Aug. 11, 2015

(54) SWITCHED-CAPACITOR BAND-PASS FILTER OF A DISCRETE-TIME TYPE, IN PARTICULAR FOR CANCELLING OFFSET AND LOW-FREQUENCY NOISE OF SWITCHED-CAPACITOR STAGES

(71) Applicant: STMicroelectronics S.r.l., Agrate Brianza (IT)

(72) Inventors: Andrea Visconti, Varese (IT); Luciano Prandi, Bellinzago Novarese (IT); Carlo Caminada, Pregnana Milanese (IT); Paolo Angelini, Bologna (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 216 days.

This patent is subject to a terminal disclaimer.

(21) Appl. No.: 13/928,024

(22) Filed: Jun. 26, 2013

(65) Prior Publication Data
US 2013/0285767 A1    Oct. 31, 2013

(30) Foreign Application Priority Data
Jun. 5, 2009    (IT) .............................. TO2009A0431

(51) Int. Cl.
*H03H 11/00* (2006.01)
*H03H 19/00* (2006.01)
*H03H 11/12* (2006.01)

(52) U.S. Cl.
CPC ........... *H03H 11/126* (2013.01); *H03H 19/004* (2013.01)

(58) Field of Classification Search
CPC . H03H 19/004; H03H 11/12; H03H 11/1217; H03H 11/126; H03H 7/0153; G11C 27/026; G11C 7/06; H03F 3/005; H03F 3/45977
USPC ............. 333/165, 166, 173; 327/96, 554, 337
See application file for complete search history.

(56) References Cited

U.S. PATENT DOCUMENTS 6,509,790 B1    1/2003  Yang
6,927,722 B2    8/2005  Hong (Continued)

OTHER PUBLICATIONS

Baschirotto, A. et al., "Finite Gain Compensated Double-Sampled Switched-Capacitor Integrators for High-Q Bandpass Filters,"IEEE Transactions on Circuits and Systems I: Fundamental Theory and Applications 39(6):425-430, Jun. 1992.

(Continued)

*Primary Examiner* — Dean Takaoka
*Assistant Examiner* — Alan Wong
(74) *Attorney, Agent, or Firm* — Seed IP Law Group PLLC

(57) ABSTRACT

A band-pass filter made up by an operational amplifier and by an input circuit. The input circuit is formed by a capacitive filtering element, connected to the input of the operational amplifier; a coupling switch, coupled between an input node and the capacitive filtering element; a capacitive sampling element, coupled between the input of the filter and the input node; and a sampling switch, coupled between the input node and a reference-potential line. The coupling switch and the input sampling switch close in phase opposition according to a succession of undesired components sampling and sensing steps, so that the capacitive sampling element forms a sampler for sampling the undesired component in the undesired components sampling step, in the absence of the component of interest, and forms a subtractor of the undesired components from the input signal in the sensing step.

22 Claims, 5 Drawing Sheets

(56) References Cited

U.S. PATENT DOCUMENTS

| | | | |
|---|---|---|---|
| 6,956,515 | B2 | 10/2005 | Keehr et al. |
| 7,038,532 | B1 | 5/2006 | Bocko et al. |
| 7,088,147 | B2 * | 8/2006 | Prasad et al. ............ 327/91 |
| 7,250,813 | B1 * | 7/2007 | Yao ........................ 330/9 |
| 7,800,427 | B2 | 9/2010 | Chae et al. |
| 8,179,183 | B2 | 5/2012 | Costa-Domingues et al. |
| 8,368,430 | B2 * | 2/2013 | Watanabe ............... 327/96 |
| 8,497,746 | B2 * | 7/2013 | Visconti et al. ......... 333/173 |
| 2005/0212591 | A1 | 9/2005 | Temes et al. |
| 2005/0248395 | A1 | 11/2005 | Zhu et al. |

OTHER PUBLICATIONS

Enz, C. et al., "Circuit Techniques for Reducing the Effects of Op-Amp Imperfections: Autozeroing, Correlated Double Sampling, and Chopper Stabilization," Proceedings of the IEEE 84(11):1584-1614, Nov. 1996.

Gola, A. et al., "A 80dB-SNR +/− 1g fully-integrated biaxial linear accelerometer in a standard 0.5um CMOS technology for high-sensitivity applications," Proceedings of the ESSCIRC, Florence, Italy, Sep. 2002, pp. 631-634.

Gregorian, R., "An offset-free switched-capacitor biquad," Microelectronics Journal 13(4):37-40, 1982.

Wongkomet, N. et al., "Correlated Double Sampling in Capacitive Position Sensing Circuits for Micromachined Applications," Proceedings of the IEEE Asia-Pacific Conference on Circuits and Systems, Chiangmai, Thailand, Nov. 24-27, 1998, pp. 723-726.

Wu, C. et al., "New Monolithic Switched-Capacitor Differentiators with Good Noise Rejection," IEEE Journal of Solid-State Circuits 24(1):177-180, Feb. 1989.

* cited by examiner

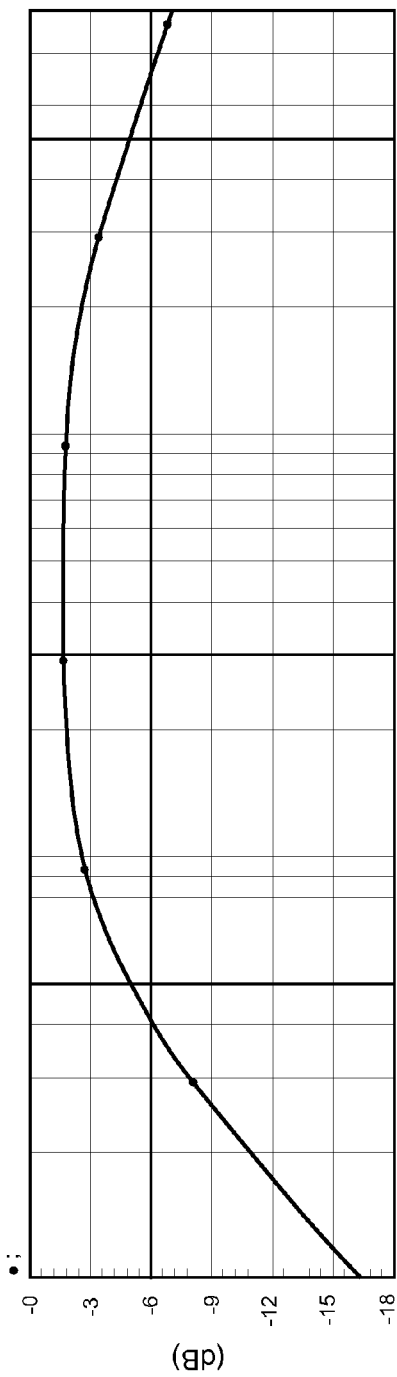
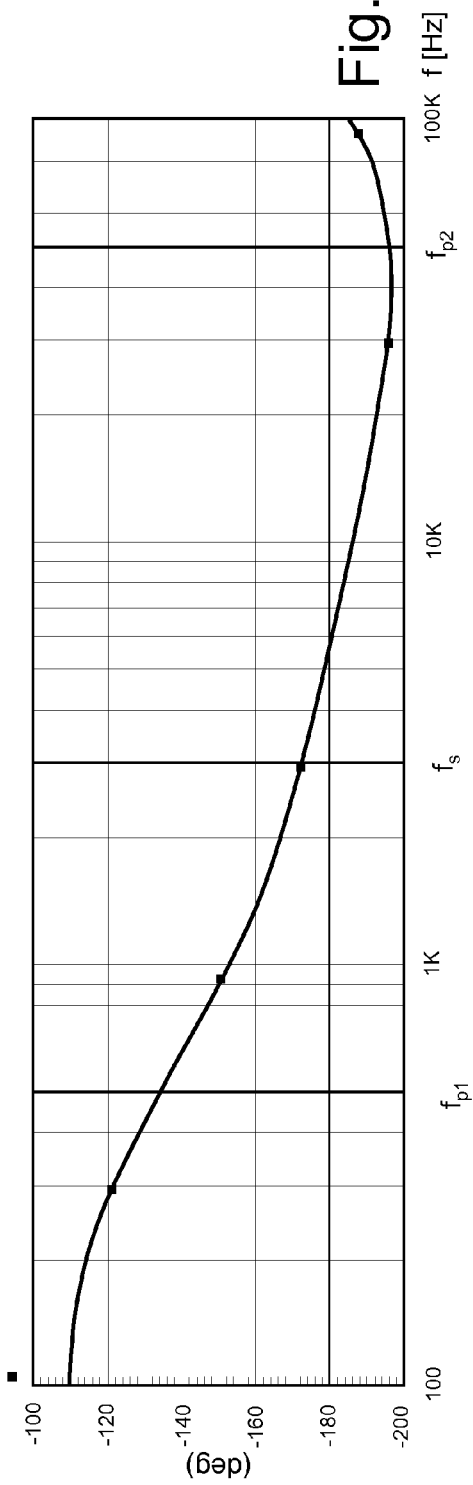
Fig.4a
Fig.4b

SWITCHED-CAPACITOR BAND-PASS FILTER OF A DISCRETE-TIME TYPE, IN PARTICULAR FOR CANCELLING OFFSET AND LOW-FREQUENCY NOISE OF SWITCHED-CAPACITOR STAGES

BACKGROUND

1. Technical Field

The present disclosure relates to a switched-capacitor band-pass filter of a discrete-time type, in particular for cancelling offset and low-frequency noise of switched-capacitor stages. For example, the present band-pass filter can be used in the control loop for driving capacitive gyroscopes made using MEMS technology.

2. Description of the Related Art

As is known, the use of micro-electro-mechanical systems (MEMS) has become increasingly widespread in various sectors of technology and has yielded encouraging results especially in the construction of inertial sensors, microintegrated gyroscopes, and electromechanical oscillators for a wide range of applications.

MEMS of this type are usually based upon micro-electro-mechanical structures comprising at least one mobile mass connected to a fixed body (stator) through springs and mobile with respect to the stator according to preset degrees of freedom. The mobile mass is moreover coupled to the fixed body via capacitive structures (capacitors). The movement of the mobile mass with respect to the fixed body, for example on account of an external stress, modifies the capacitance of the capacitors; the variation of capacitance can be exploited to detect the relative displacement of the mobile mass with respect to the fixed body and thus the applied force. Vice versa, by supplying appropriate biasing voltages, it is possible to apply an electrostatic force to the mobile mass to set it in motion. In addition, to produce electromechanical oscillators, the frequency response of the inertial MEMS structures is exploited, which is typically of a second-order low-pass type.

Many MEMS (in particular, all the electromechanical oscillators and gyroscopes) envisage a driving device, which has the task of maintaining the mobile mass in oscillation.

Consequently, a driving system is provided, which controls in a precise way the movement of the mobile mass and includes a sensing amplifier operating in discrete-time mode. In order for the driving system to operate correctly with the desired precision level, it is useful to eliminate the offset of the sensing amplifier, as well as the so-called "flicker noise" or "1/f noise", at low frequency, due, as is known, to random capture and release of charge carriers. In order not to interfere in the driving loop, filtering of the noise should not introduce phase shifts in the signal.

The same desires are also shared by other types of circuits, which would benefit from a discrete-time band-pass filtering, without the introduction of any phase shift.

In order to eliminate the offset of a micromechanical structure, derivative filters are normally used in the case of a continuous-time read chain; alternatively, a factory calibration is exploited. These solutions, in the case of drifts in the self-oscillation frequency of the mechanics due to ageing or temperature, do not enable a constant phase shift to be maintained, since the position of singularities, and thus the phase shift introduced at the frequency of interest, depends upon these parameters.

In literature, systems have been proposed using chopping techniques, which include a high-frequency offset modulation, filtering, and demodulation. These solutions require, however, a complex signal processing and are not able to offer a good control of the introduced phase shift.

BRIEF SUMMARY

One embodiment is a band-pass filter capable of solving the problems that afflict known systems, in particular eliminating the offset and attenuating the flicker noise of the preceding stage up to frequencies higher than the frequency of the signal of interest.

According to the present disclosure, a switched-capacitance band-pass filter and a corresponding method of operation are provided, as defined in claims 1 and 11, respectively.

BRIEF DESCRIPTION OF THE SEVERAL VIEWS OF THE DRAWINGS

For a better understanding of the present disclosure, preferred embodiments thereof are now described, purely by way of non-limiting example, with reference to the attached drawings, wherein:

FIGS. 4a and 4b show two simulations regarding the circuit of FIG. 2; and

DETAILED DESCRIPTION

Figure 1:
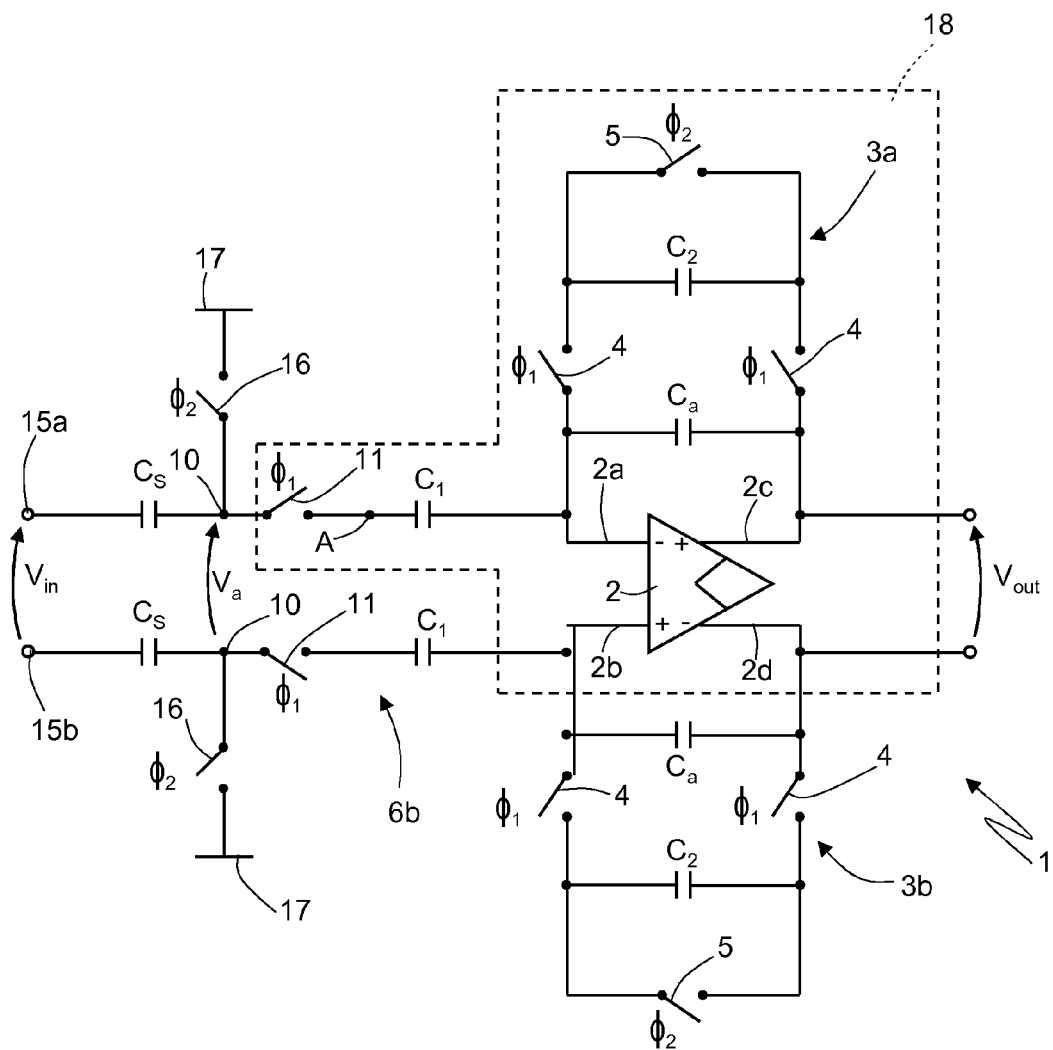
FIG. 1 is a circuit diagram of a first embodiment of the present band-pass filter.
Figure 1A:
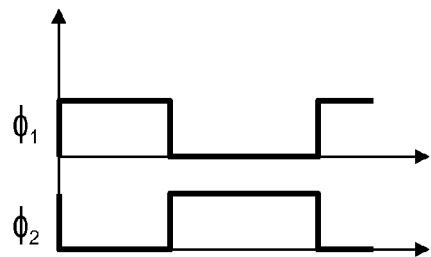
FIG. 1a shows the plot of control signals used in the circuit of FIG. 1.

FIG. 1 shows a filter 1 of a switched-capacitor double-ended band-pass type, which uses the correlated-double-sampling technique at its input.

The filter 1 comprises an operational amplifier 2 having an inverting input 2a, a non-inverting input 2b, a non-inverting output 2c, and an inverting output 2d. Furthermore, the outputs 2c and 2d form the outputs of the filter 1, and the two inputs 2a, 2b are at virtual ground.

A first feedback branch 3a is connected between the inverting input 2a and the non-inverting output 2c; a second feedback branch 3b is connected between the non-inverting input 2b and the inverting output 2d.

The feedback branches 3a and 3b are equal and comprise a first feedback capacitor $C_a$, connected between the respective input 2a, respectively 2b, and the respective output 2c, respectively 2d; and a second feedback capacitor $C_2$, connected in parallel to the first capacitor $C_a$ through a pair of feedback switches 4 controlled by a same first phase signal $\Phi_1$. In addition, the second capacitor $C_2$ can be by-passed through a by-pass switch 5, which is controlled by a second phase signal $\Phi2$, in phase opposition with respect to the first phase signal $\Phi_1$, and enables reset of the second feedback capacitor $C_2$, eliminating part of the charge injected during the phase $\Phi_1$, and thus determining the position of the pole of the high-pass filtering.

Furthermore, the inputs 2a and 2b of the operational amplifier 2 are connected to a first input branch 6a, and a second input branch 6b, respectively, which are equal. In detail, each input branch 6a, 6b comprises a filtering capacitor $C_1$ having a first terminal directly connected to the respective input $2a$ and $2b$ of the operational amplifier 2 and a second terminal connected to a node 10 through a coupling switch 11 controlled by the first phase signal $\Phi_1$; an input sampling capacitor $C_s$ connected between the node 10 and a respective input $15a$, respectively $15b$, of the filter 1; and an input sampling switch 16, arranged between a respective node 10 and a common-potential line 17 (at a common-mode potential) and controlled by the second phase signal $\Phi 2$.

The transfer function of the filter 1 can be calculated as described hereinafter.

Consider initially the circuit 18 enclosed by the dashed line and formed by the operational amplifier 2, single-ended (the input $2b$ is connected to common mode and no output $2d$ is present), just the first feedback branch $3a$, the filtering capacitor $C_1$, and the coupling switch 11 of just the first input branch $6a$. These components form a single-ended high-pass filter. In the circuit 18, in a first step, referred to also as read or sensing step, the first phase signal $\Phi_1$ is active and the second phase signal $\Phi 2$ is inactive and, in a second step, referred to also as undesired-components sampling step, the first phase signal $\Phi_1$ is inactive and the second phase signal $\Phi 2$ is active.

In the sensing step, the capacitors $C_1$, $C_2$, and $C_a$ store a charge $Q_1$, while in a second step, the capacitors $C_1$, $C_a$ store a charge $Q_2$, with $$Q_1 = C_1 V_{in} + (C_2 + C_a) V_{out}$$

$$Q_2 = C_1 V_{in} z^{-1} + C_a V_{out} z^{-1}$$

By applying the charge-conservation principle to the capacitors and equating the stored charges $Q_1$ and $Q_2$, the transfer function $T_{HP}(z) = V_{out}/V_a$ is obtained:

$$T_{HP}(z) = \frac{-C_1}{C_2 + C_a} \cdot \frac{1 - z^{-1}}{1 - \left(\frac{C_a}{C_2 + C_a}\right) z^{-1}}$$

which is also the transfer function of the fully differential double-ended high-pass filter, obtained considering also the second feedback branch $3b$, the filtering capacitor $C_1$, and the coupling switch 11 of the second input branch $6b$.

The input sampling capacitors $C_s$ have the purpose of sampling and storing the undesired components (input offset, flicker noise and/or possible noise of any other type at low frequency, where "low frequency" indicates a much lower frequency, for example by one order of magnitude, than the switching frequency of the phase signals) during the second step and of cancelling it during the first step. This introduces, on the useful signal, a low-pass type filtering and an attenuation. In fact, by computing the charge balance at node 10, the following transfer function $T_{LP}(z)$ between $V_{in}$ and $V_a$:

$$T_{LP}(z) = \frac{C_S}{C_1 + C_S} \cdot \frac{1}{1 - \left(\frac{C_1}{C_1 + C_S}\right) z^{-1}}$$

The overall transfer function $T_{BP}(z)$ of the filter 1 derives from the combination of the transfer functions $T_{HP}(z)$ and $T_{LP}(z)$:

$$T_{BP}(z) = T_{LP}(z) \cdot T_{HP}(z) = \qquad (1)$$

$$\frac{-C_1 C_S}{(C_1 + C_S)(C_a + C_2)} \frac{1 - z^{-1}}{\left(1 - \left(\frac{C_1}{C_1 + C_S}\right) z^{-1}\right)\left(1 - \left(\frac{C_a}{C_a + C_2}\right) z^{-1}\right)}$$

By applying the bilinear transformation $$f = \frac{f_{ck}}{\pi} \cdot \left(\frac{1 - z_p}{1 + z_p}\right)$$

the position of the singularities of the continuous-time equivalent of the filter 1 is:

$$f_z = 0$$

$$f_{p1} = \frac{f_{ck}}{\pi} \cdot \left(\frac{C_2}{2C_a + C_2}\right)$$

$$f_{p2} = \frac{f_{ck}}{\pi} \cdot \left(\frac{C_S}{2C_1 + C_S}\right)$$

In practice, in the undesired-components sampling step, when the first phase signal $\Phi_1$ is inactive and the second phase signal $\Phi_2$ is active, the sampling capacitors $C_s$ store the undesired components on the inputs $15a$, $15b$. In this step, the filtering capacitors $C_1$ hold the signal of interest, since the coupling switches 11 are open and the nodes A of the filtering capacitors $C_1$ are floating. In the next read or sensing step, when the first phase signal $\Phi_1$ is active and the second phase signal $\Phi_2$ is inactive, the signal of interest is supplied to the filtering capacitors $C_1$, and the undesired components are subtracted by the sampling capacitors $C_s$. In this step, the nodes A are biased through the input sampling capacitors $C_s$ by charge sharing. Consequently, in neither of the two steps are the nodes A directly connected to the common-potential line 17; this prevents the signal of interest stored on the filtering capacitors $C_1$ from being cancelled.

In practice, the signal of interest and the undesired components on the input (offset of the preceding stage and flicker noise) are treated differently. In fact, the signal of interest, which is supplied only in the sensing step, sees a band-pass filter (for example, in the case of a control loop for driving a gyroscope, with passband of approximately 400 Hz to 40 kHz, necessary for maintaining the loop in oscillation), and the undesired components, present also in the undesired-components sampling step, see a high-pass filter (in the considered case, for example with lower limit of the band at approximately 20 kHz).

Figure 2:
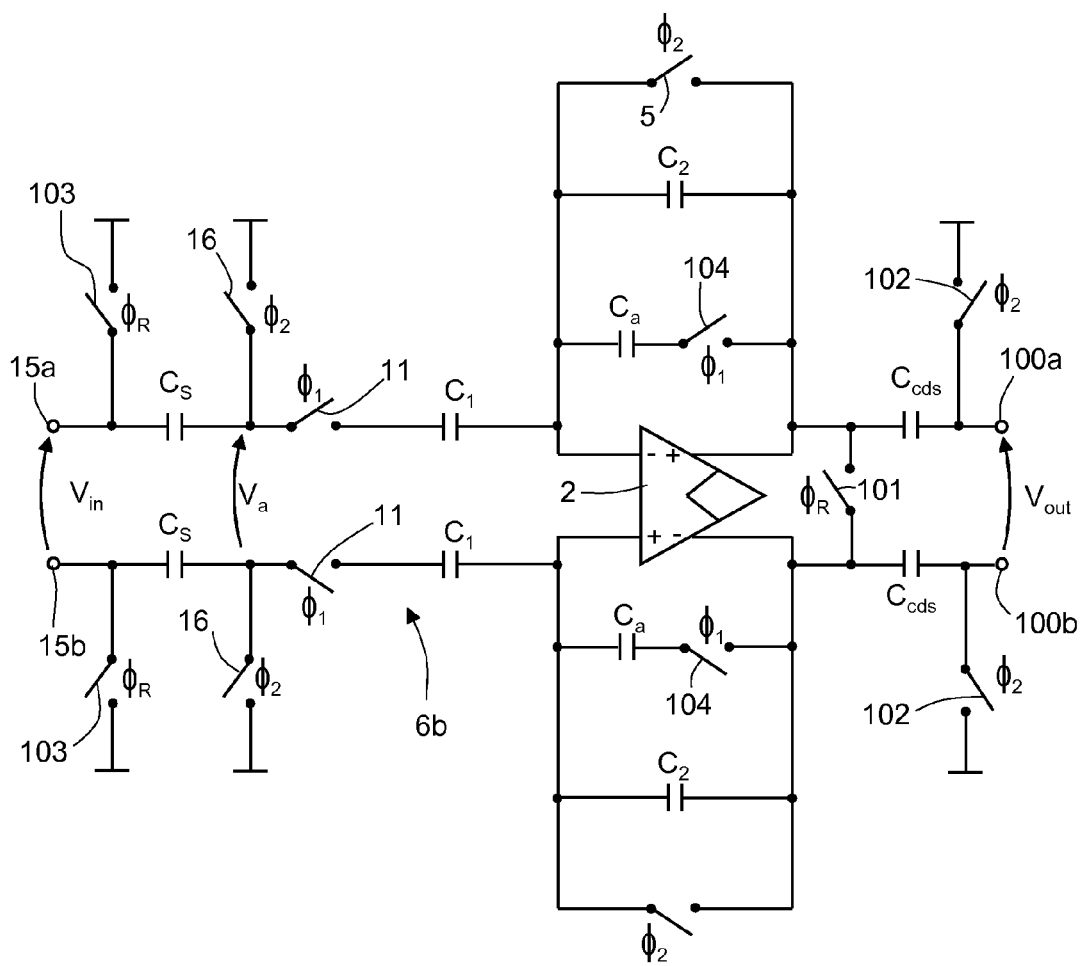
FIG. 2 is a circuit diagram of a second embodiment of the present band-pass filter.
Figure 2A:
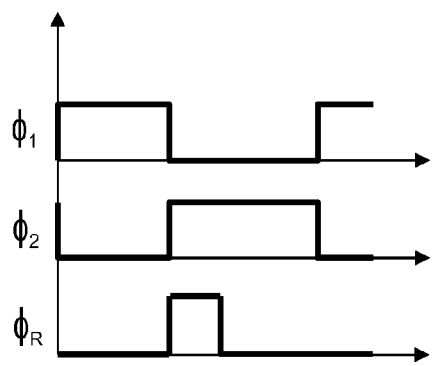
FIG. 2a shows the plot of control signals used in the circuit of FIG. 2.

FIG. 2 shows a filter 100 that further enables elimination of the offset and of the flicker noise of the band-pass filter, and uses a third phase signal $\Phi_R$ (referred to also as reset signal), which commands a reset step.

The filter 100, in addition to the components of the filter 1 of FIG. 1, comprises a pair of output sampling capacitors $C_{cds}$, each connected between a respective output $2c$, $2d$ of the operational amplifier 2 and a respective output terminal $100a$, $100b$ of the filter 100. In addition, an output reset switch 101 is arranged between the outputs $2c$, $2d$ of the operational amplifier 2 and is controlled by a reset signal $\Phi_R$, the time plot whereof is shown in FIG. $2a$. Two output sampling switches 102 are arranged between a respective output $100a$, respectively $100b$, of the filter 100 and the common-potential line 17 and are controlled by the second phase signal $\Phi_2$. Two input reset switches 103 are arranged between a respective input 15a, respectively 15b of the filter 100 and the common-potential line 17.

In FIG. 2, in order to prevent the first feedback capacitors $C_a$ (which store the signal of interest) from being discharged during offset and sampling, instead of the feedback switches 4 a single insulation switch 104 is provided in series to each first feedback capacitor $C_a$.

Figure 3A:
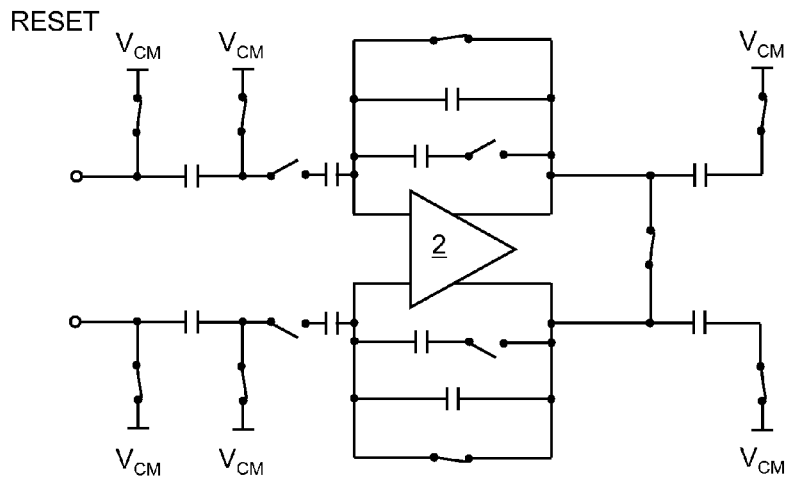
FIGS. 3a-3c show the circuit of FIG. 2 in three different operating steps.
Figure 3B:
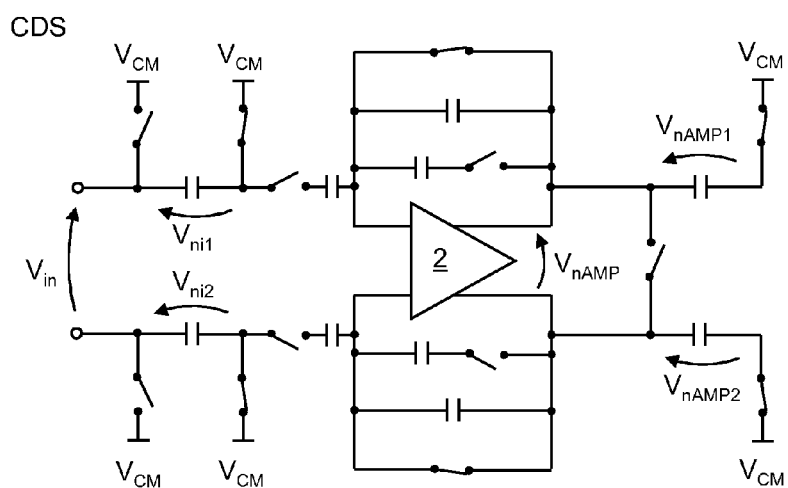
Figure 3C:
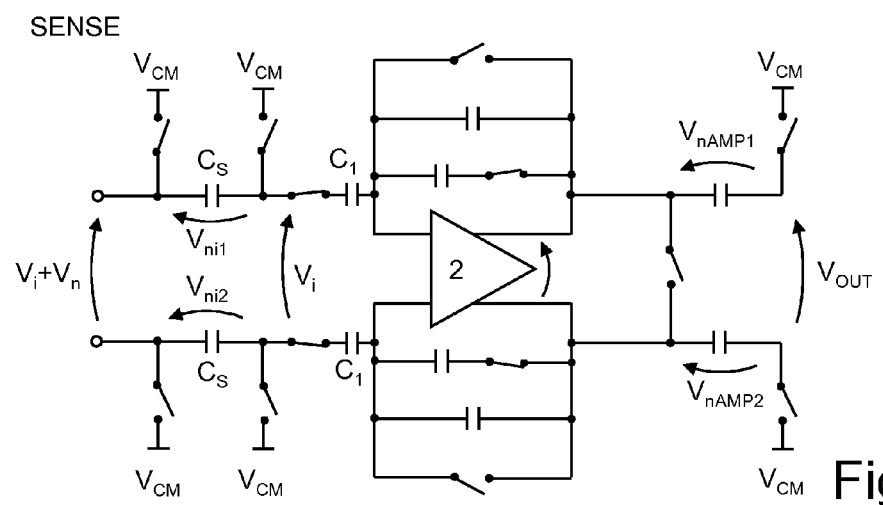

Operation of the filter 100 of FIG. 2 will now be explained with reference to FIGS. 3a, 3b, and 3c, which regard respectively the reset step, the undesired-components sampling step, and the sensing step. In particular, during the reset step (FIG. 3a), the reset signal $\Phi_R$ and the second phase signal $\Phi_2$ are high and the first phase signal $\Phi_1$ is low. Consequently, the switches 101-103, 16 and 5 are closed, the switches 11 and 104 are open, and the input sampling capacitors $C_s$ and the output sampling capacitors $C_{cds}$ are completely discharged.

During the undesired-components sampling step (FIG. 3b), the second phase signal $\Phi_2$ is high, the reset signal $\Phi_R$ and the first phase signal $\Phi_1$ are low, and thus the switches 16, 5, and 102 are closed and the switches 103, 11, 104 and 101 are open. Consequently, the low-frequency undesired input component $V_n$ (typically due to the offset of the preceding stage and to the flicker noise) is stored as $V_{n1}$ and $V_{n2}$ on the input sampling capacitors $C_s$, and the low-frequency undesired output component $V_{nAMP1}$, $V_{nAMP2}$ (due mainly to the offset of the operational amplifier 2) is stored on the output sampling capacitors $C_{cds}$. In the undesired-components sampling step, as in the preceding reset step, the first feedback capacitors $C_a$ are insulated from the rest of the circuit and thus do not lose the signal stored, preventing the transfer function of the filter from being altered.

During the sensing step (FIG. 3c), the first phase signal $\Phi_1$ is high, the reset signal $\Phi_R$ and the second phase signal $\Phi_2$ are low, and thus the switches 104 and 11 are closed and the switches 16, 5, and 101-103 are open. Consequently, by appropriately sizing the filter, the undesired d.c. and low-frequency components are subtracted (practically, they are filtered out) and the signal $V_i$ downstream of the input sampling capacitors $C_s$ is no longer affected by the undesired components $V_n$. In addition, in this same step, the useful signal $V_i$ thus obtained is sampled, filtered, and immediately outputted as $V_{out}$, without undergoing any delay.

Operation of the filter 100 was simulated at a frequency $f_{ck}$=164 kHz, and the transfer function was obtained, having the plot vs. frequency shown in FIGS. 4a and 4b, relative to magnitude and phase, respectively. As may be noted, the filter 100 shows a zero in the origin, a first pole at $f_{p1}$=400 Hz and a second pole at $f_{p2}$=40 kHz; the useful signal of the filter 1 has a frequency $f_s$=4 kHz.

Figure 5:
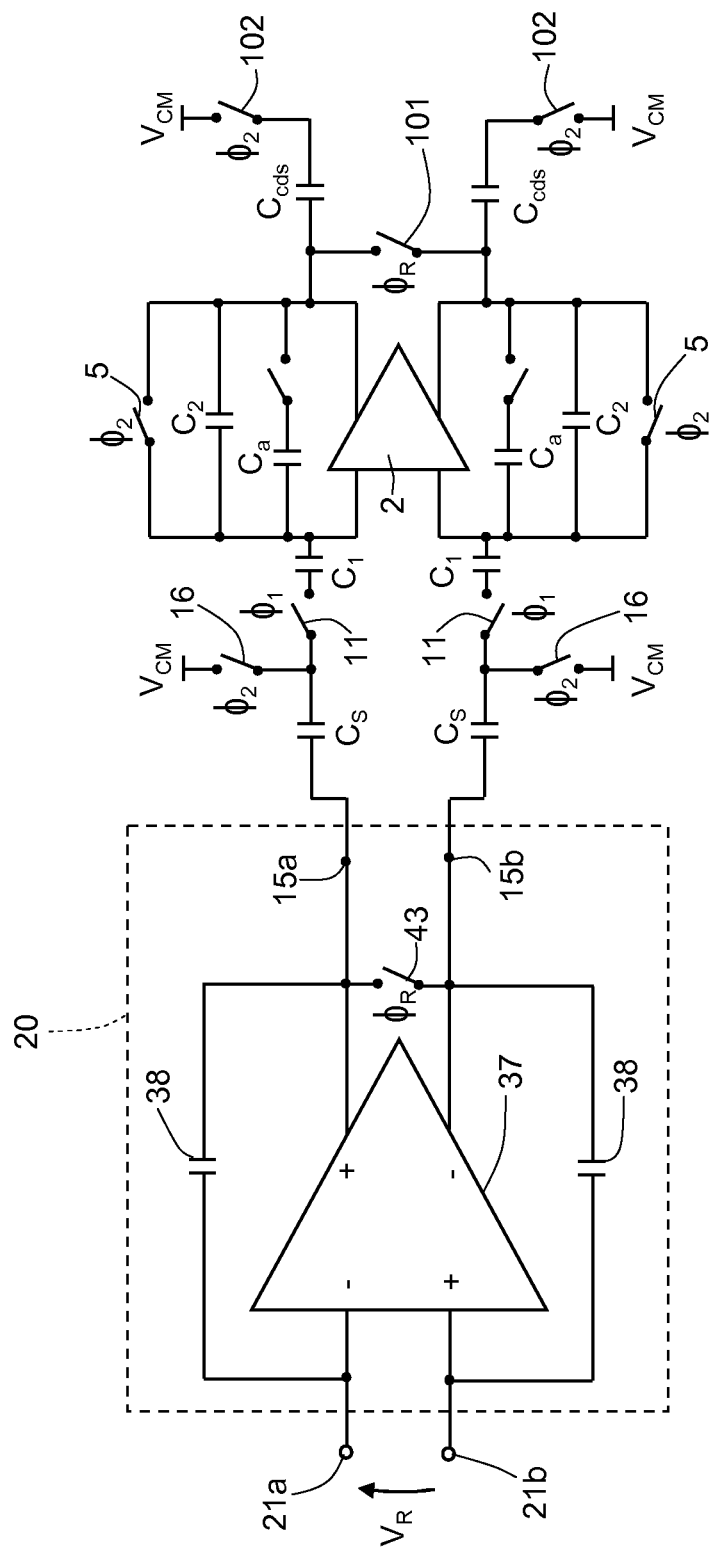
FIG. 5 shows a block diagram of a charge amplifier connected to the filter of FIG. 2.

The filter 100 of FIG. 2 can be used to eliminate the offset and the flicker noise of a charge amplifier 20 arranged upstream of the filter 100, as shown in FIG. 5. The charge amplifier 20, of a switched-capacitor discrete-time type, has inputs respectively connected to a first feedback reading terminal 21a and to a second feedback reading terminal 21b.

The charge amplifier 20 comprises a fully differential operational amplifier 37 in charge-integrator configuration, with integration capacitors 38 arranged between a respective input and a respective output, and an output reset switch 43, controlled by the reset signal $\Phi_R$. Alternatively, instead of the output reset switch 43, the reset switches 103, shown in FIG. 2, may be provided.

During the reset step, the output switch 43 is closed. In this way, the nodes of the operational amplifier 37 are fixed to the common-mode voltage $V_{CM}$ and, as described with reference to FIG. 3a, the input sampling capacitors $C_s$ are discharged.

In the undesired-components sampling step, the output reset switch 43 is open and the undesired low-frequency components are stored on the input sampling capacitors $C_s$.

Next, in the sensing step, the reading signal $V_R$ across the inputs 21a, 21b of the charge amplifier 37 is amplified and supplied to the filter 100, which suppresses the undesired components, as above described with reference to FIG. 3b.

The band-pass filter described herein presents numerous advantages.

In particular, it enables elimination of the undesired d.c. and low-frequency components by precisely controlling the introduced phase shift. This is particularly advantageous in the case of use in a gyroscope driving control loop and in all the circuits where it is important not to modify the phase of the signal.

The present band-pass filter enables filtering of disturbance up to a higher frequency than the working one. For example, in prototypes obtained by the applicant, it is capable of filtering the 1/f noise up to 10-20 kHz, with a working frequency of 4 kHz.

In addition, in the described filter, the positions of the pole and of the zero are directly linked to the frequency of the phases $f_{ck}$, as appears clearly from Eq. (1), and shift as the frequency of oscillation varies, maintaining their own relative position with respect to the signal to be processed. This is particularly advantageous in the case of use in the gyroscope driving control loop, where the phases are generated by exploiting a self-oscillation of the electromechanical system, the resonance frequency whereof can vary from piece to piece on account of the spread of the production process and of ageing. With the present band-pass filter, variations of the oscillation frequency due to process spread, temperature variations, and ageing are recovered by shifts of the singularities of the transfer function of the filter. Frequency and phase shift are consequently well controlled.

Finally, it is clear that modifications and variations may be made to the filter described and illustrated herein, without thereby departing from the scope of the present disclosure, as defined in the attached claims. For example, the solution described is also applicable to a single-ended structure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A filter, comprising:
    a first input configured to receive a time-discrete signal formed by a first component and by an undesired component;
    a first output;
    an operational amplifier having a first input and a first output, the first output of the operational amplifier being coupled to the first output of the filter;

a first input branch including:
   an input node;
   a filtering element coupled between the first input of the operational amplifier and the input node; and
   an input sampling element coupled between the first input of the filter and the input node, the input sampling element being configured to sample the undesired component in an undesired component sampling step, in absence of the first component, and subtract the undesired component from the time-discrete signal in a sensing step.

2. A filter according to claim 1, comprising:
   a first feedback capacitive element coupled between the first input and the first output of the operational amplifier;
   a second feedback capacitive element coupled in parallel to the first feedback capacitive element; and
   a first decoupling switch configured to decouple the first and second feedback capacitive elements from each other in the sensing step.

3. A filter according to claim 2, wherein the first decoupling switch is arranged between a first terminal of the first feedback capacitive element and a first terminal of the second feedback capacitive element.

4. A filter according to claim 2, wherein the first decoupling switch is arranged between the first feedback capacitive element and the first input or the first output of the operational amplifier.

5. A filter according to claim 1, further comprising a first correlated double-sampling circuit including:
   an output sampling capacitive element coupled between the first output of the operational amplifier and the first output of the filter;
   an output sampling switch arranged between a first terminal of the output sampling capacitive element and a reference potential line; and
   an output reset switch coupled to a second terminal of the output sampling capacitive element and the reference potential line,
   the output sampling switch being configured to close during the undesired component sampling step and the reset switch being configured to close in a reset step at a beginning of the undesired component sampling step.

6. A filter according to claim 5, wherein the operational amplifier is a fully differential amplifier and comprises a second input, a second output, and a second correlated double-sampling circuit coupled to the second output of the operational amplifier, the output reset switch being coupled between the first and second outputs of the operational amplifier.

7. A filter according to claim 5, further comprising an input reset switch coupled between the first input of the filter and the reference potential line and configured so as to close in the reset step.

8. A filter according to claim 7, wherein the operational amplifier is a fully differential amplifier and comprises a second input and a second output, the filter further comprising:
   a second input branch coupled between the second input of the filter and the second input of the operational amplifier; and
   a further reset switch being coupled between the first and second inputs of the filter.

9. A filter according to claim 1, wherein the operational amplifier is a fully differential amplifier.

10. A filter according to claim 1, wherein:
    the input sampling element includes:
       an input sampling capacitive element coupled between the first input of the filter and the input node; and
       an input sampling switch coupled between the input node and a reference potential line; and
    the filtering element includes a filtering capacitive element and a coupling switch coupled together between the first input of the operational amplifier and the input node.

11. A time-discrete switched capacitor circuit, comprising:
    a switched capacitor discrete amplifier having an output; and
    a filter that includes:
       a first input coupled to the output of the discrete amplifier and configured to receive a time-discrete signal formed by a first component and by an undesired component;
       a first output;
       an operational amplifier having a first input and a first output, the first output of the operational amplifier being coupled to the first output of the filter;
       a first input branch including:
          an input node;
          a filtering element coupled between the first input of the operational amplifier and the input node; and
          an input sampling element coupled between the first input of the filter and the input node, the input sampling element being configured to sample the undesired component in an undesired component sampling step, in absence of the first component, and subtract the undesired component from the time-discrete signal in a sensing step.

12. A circuit according to claim 11, wherein the discrete amplifier is a charge amplifier.

13. A circuit according to claim 11, wherein the filter includes:
    a first feedback capacitive element coupled between the first input and the first output of the operational amplifier;
    a second feedback capacitive element coupled in parallel to the first feedback capacitive element; and
    a first decoupling switch configured to decouple the first and second feedback capacitive elements from each other in the sensing step.

14. A circuit according to claim 13, wherein the first decoupling switch is arranged between a terminal of the first feedback capacitive element and a terminal of the second feedback capacitive element.

15. A circuit according to claim 13, wherein the first decoupling switch is arranged between the first feedback capacitive element and the first input or the first output of the operational amplifier.

16. A circuit according to claim 11, wherein the filter includes a first correlated double-sampling circuit including:
    an output sampling capacitive element coupled between the first output of the operational amplifier and the first output of the filter;
    an output sampling switch arranged between a first terminal of the output sampling capacitive element and a reference potential line; and
    an output reset switch coupled to a second terminal of the output sampling capacitive element and the reference potential line,
    the output sampling switch being configured to close during the undesired component sampling step and the reset switch being configured to close in a reset step at a beginning of the undesired component sampling step.

17. A circuit according to claim 16, wherein the operational amplifier is a fully differential amplifier and comprises a second input, a second output, and a second correlated double-sampling circuit coupled to the second output of the operational amplifier, the output reset switch being coupled between the first and second outputs of the operational amplifier.

18. A circuit according to claim 16, wherein the filter includes an input reset switch coupled between the first input of the filter and the reference potential line and configured so as to close in the reset step.

19. A circuit according to claim 18, wherein the operational amplifier is a fully differential amplifier and comprises a second input and a second output, the filter further comprising:
- a second input branch coupled between the second input of the filter and the second input of the operational amplifier; and
- a further reset switch being coupled between the first and second inputs of the filter.

20. A circuit according to claim 11, wherein:
the input sampling element includes:
- an input sampling capacitive element coupled between the first input of the filter and the input node; and
- an input sampling switch coupled between the input node and a reference potential line; and the filtering element includes a filtering capacitive element and a coupling switch coupled together between the first input of the operational amplifier and the input node.

21. A method for reducing an offset and noise of a filter, the method comprising:
- receiving at an input of the filter time-discrete signal, formed in a first phase by an undesired component and in a second phase by a first component and the undesired component;
- sampling the time-discrete signal by decoupling a filtering element from the input of the filter; and storing the undesired component in an input sampling element that is coupled to the input of the filter;
- subtracting the undesired component from the time-discrete signal by coupling the input sampling element between the input of the filter and the filtering capacitive element; and
- generating, from the time-discrete signal, a filtered first component at an output of the filter.

22. A method according to claim 21, further comprising resetting the filter at the beginning of the sampling by decoupling the input sampling element from the input of the filter and discharging the input sampling element.

\* \* \* \* \*

UNITED STATES PATENT AND TRADEMARK OFFICE
CERTIFICATE OF CORRECTION

| | | |
|---|---|---|
| PATENT NO. | : 9,106,208 B2 | Page 1 of 1 |
| APPLICATION NO. | : 13/928024 | |
| DATED | : August 11, 2015 | |
| INVENTOR(S) | : Andrea Visconti et al. | |

It is certified that error appears in the above-identified patent and that said Letters Patent is hereby corrected as shown below:

On The Title Page,

Item (63):
Insert --Continuation of application No. 12/794,428, filed on June 4, 2010, now Pat. No. 8,497,746.--.

In The Claims,

Column 10, Line 6:
"receiving at an input of the filter time-discrete signal," should read, --receiving at an input of the filter a two-phase time-discrete signal,--.

Signed and Sealed this
First Day of March, 2016

Michelle K. Lee
*Director of the United States Patent and Trademark Office*